(12) United States Patent
Daryl Wee et al.

(10) Patent No.: US 10,937,744 B2
(45) Date of Patent: Mar. 2, 2021

(54) SEMICONDUCTOR PACKAGES INCLUDING ROUGHENING FEATURES

(71) Applicant: Infineon Technologies AG, Neubiberg (DE)

(72) Inventors: Wern Ken Daryl Wee, Melaka (MY); Sock Chien Tey, Melaka (MY); Si Hao Vincent Yeo, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/282,506

(22) Filed: Feb. 22, 2019

(65) Prior Publication Data
US 2020/0273813 A1 Aug. 27, 2020

(51) Int. Cl.
| | |
|---|---|
| *H01L 23/00* | (2006.01) |
| *H01L 23/31* | (2006.01) |
| *H01L 23/495* | (2006.01) |
| *H01L 21/56* | (2006.01) |
| *H01L 23/498* | (2006.01) |
| *H01L 21/48* | (2006.01) |

(52) U.S. Cl.
CPC ........ *H01L 23/562* (2013.01); *H01L 21/4825* (2013.01); *H01L 21/4835* (2013.01); *H01L 21/4842* (2013.01); *H01L 21/565* (2013.01); *H01L 23/3128* (2013.01); *H01L 23/4952* (2013.01); *H01L 23/49513* (2013.01); *H01L 23/49548* (2013.01); *H01L 23/49582* (2013.01); *H01L 23/49861* (2013.01)

(58) Field of Classification Search
CPC ............... H01L 23/562; H01L 21/4842; H01L 21/4835; H01L 23/49861; H01L 23/3128; H01L 23/49548; H01L 21/4825; H01L 23/4952; H01L 21/565; H01L 23/49582; H01L 23/49513; H01L 23/49503–49513
USPC ........................................................ 257/669
See application file for complete search history.

(56) References Cited

U.S. PATENT DOCUMENTS

| | | | | |
|---|---|---|---|---|
| 6,218,629 | B1* | 4/2001 | Brofman | ................. H01L 24/83 174/257 |
| 6,221,696 | B1* | 4/2001 | Crema | ................ H01L 21/4821 438/118 |
| 9,659,898 | B1* | 5/2017 | Railkar | ............. H01L 23/49513 |
| 10,083,896 | B1* | 9/2018 | Zhang | ............... H01L 23/49541 |
| 2008/0216921 | A1* | 9/2008 | Kwan | ....................... C22C 1/00 148/95 |
| 2009/0039486 | A1* | 2/2009 | Shimazaki | ............ H01L 21/561 257/676 |

(Continued)

FOREIGN PATENT DOCUMENTS

| | | |
|---|---|---|
| JP | S6422038 | 1/1989 |
| JP | H07326699 | 12/1995 |
| JP | 2013153126 | 8/2013 |

*Primary Examiner* — Mohammad M Hoque
(74) *Attorney, Agent, or Firm* — Dicke, Billig & Czaja, PLLC

(57) ABSTRACT

A semiconductor package includes a substrate, a semiconductor die, dendrite, and a mold material. The substrate includes a die pad. The die pad includes roughening features. The semiconductor die is attached to the die pad such that the roughening features are adjacent to the semiconductor die. The dendrite is on the roughening features adjacent to the semiconductor die. The mold material encapsulates the semiconductor die, the dendrite, and at least a portion of the substrate.

10 Claims, 14 Drawing Sheets

(56) References Cited

U.S. PATENT DOCUMENTS

2012/0009739 A1 1/2012 Abbott
2016/0315054 A1 10/2016 Kajihara et al.

* cited by examiner

SEMICONDUCTOR PACKAGES INCLUDING ROUGHENING FEATURES

BACKGROUND

Lead delamination and die pad delamination may occur due to poor adhesion between a mold material and the die pad and/or leads of a lead frame. Poor adhesion between a mold material and the die pad and/or leads of the lead frame may be due to no roughening of the die pad and/or leads. Surface treatments on the die pad and/or leads (e.g., roughening processes or chemical coatings to enhance adhesion) may be applied prior to the semiconductor package assembly process (i.e., prior to die attach).

For these and other reasons, a need exists for the present disclosure.

SUMMARY

The inventors of the present disclosure have found that surface treatments may be unable to improve adhesion if the die pad and/or leads are contaminated during the semiconductor package assembly process (e.g., during die attach). Organic or inorganic contaminants or glue resin bleed on any part of the lead frame may not be removable using pretreatment processes or plasma processes before the molding process. Aggressive chemical or other cleaning methods are not able to target areas of interest and may be corrosive and damaging to the semiconductor package, die, wires, etc.

Accordingly, one example of a semiconductor package includes a substrate, a semiconductor die, dendrite, and a mold material. The substrate includes a die pad. The die pad includes roughening features. The semiconductor die is attached to the die pad such that the roughening features are adjacent to the semiconductor die. The dendrite is on the roughening features adjacent to the semiconductor die. The mold material encapsulates the semiconductor die, the dendrite, and at least a portion of the substrate.

Another example of a semiconductor package includes a substrate, a semiconductor die, laser cleaned and formed roughening features, dendrite, and a mold material. The substrate includes a die pad. The semiconductor die is attached to the die pad. The laser cleaned and formed roughening features are on portions of the die pad adjacent to the semiconductor die such that the portions of the die pad adjacent to the semiconductor die are free of contaminants. The dendrite is on the roughening features adjacent to the die. The mold material encapsulates the semiconductor die, the dendrite, and at least a portion of the substrate.

One example of a method for fabricating a semiconductor package includes attaching a semiconductor die to a die pad of a substrate. The method includes after attaching the semiconductor die, laser cleaning and roughening portions of the die pad adjacent to the semiconductor die. The method includes applying a mold material over the semiconductor die and at least a portion of the substrate.

DETAILED DESCRIPTION

In the following Detailed Description, reference is made to the accompanying drawings, which form a part hereof, and in which is shown by way of illustration specific embodiments in which the disclosure may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present disclosure. The following detailed description, therefore, is not to be taken in a limiting sense, and the scope of the present disclosure is defined by the appended claims.

It is to be understood that the features of the various exemplary embodiments described herein may be combined with each other, unless specifically noted otherwise.

Disclosed herein are semiconductor packages fabricated using laser irradiation to selectively clean a metal surface after a die attach process that may result in organic contamination and/or inorganic contamination on the metal surface. The organic contamination may include, for example, epoxy glue resin bleed, anti-tarnish, oxidation of metal, protection layers on the metal surface, volatile or non-volatile solvents on the metal surface, etc. The inorganic contamination may include, for example, solder flux, Sulphur contamination, etc. The laser irradiation burns off the contaminants without re-deposition issues and at the same time locally melts the metal surface to increase the surface ratio and roughness of the metal surface. The laser cleaning and roughening process may be applied to any package/lead frame design. The increased roughness improves the adhesion of the metal surface with a mold material. In addition, the laser cleaning may enhance dendrite growth (e.g., A2 dendrite growth). The heat affected zone from the laser irradiation on the targeted area is minimal hence damage to the die/product is minimal.

Figure 1A:
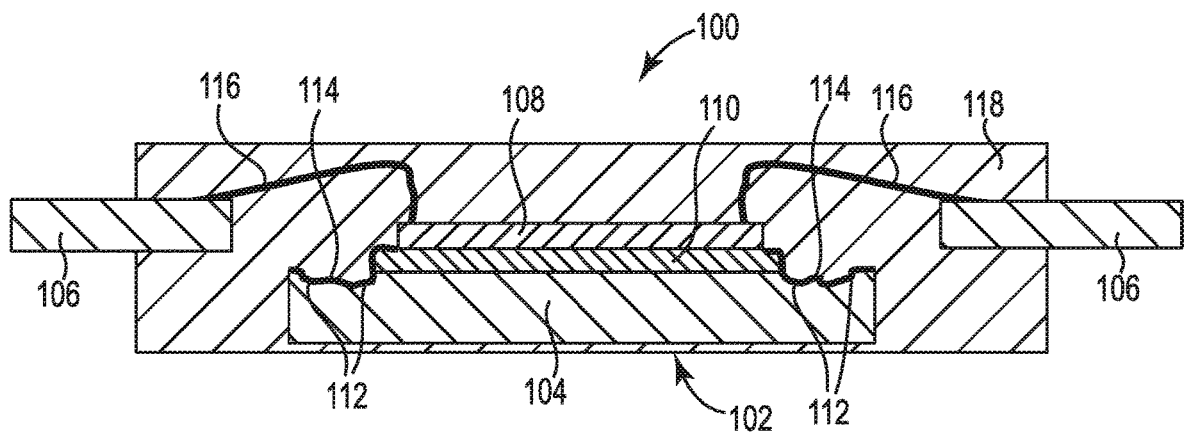
FIG. 1A illustrates a cross-sectional view of one example of a semiconductor package.

FIG. 1A illustrates a cross-sectional view of one example of a semiconductor package 100. Semiconductor package 100 is a leaded semiconductor package. Semiconductor package 100 includes a substrate 102 and a semiconductor die 108. Substrate 102 (e.g., a lead frame) includes a die pad 104 and leads 106. Lead frame 102 has a metal surface, such as Ag, Cu, Ni/Pd/Au, NiNiP, Ni/Pd/AuAg. Die pad 104 includes roughening features 112. The semiconductor die 108 is attached to the die pad 104 such that the roughening features 112 are adjacent to the semiconductor die 108. The area of die pad 104 where semiconductor die 108 is attached to die pad 104 may be free of roughening features.

Roughening features 112 may include a line pattern, a cross pattern, a zig zag pattern, a crisscross pattern, a dot pattern, a wave pattern, a dashed pattern, a diagonal line pattern, a box pattern, or another suitable pattern or combination of patterns on the surface of die pad 104 adjacent to the semiconductor die 108. The roughening features 112 may have a depth within a range between 0.5 µm and 5 µm, a pitch within a range between 10 µm and 50 µm, and/or a width within a range between 10 µm and 50 µm as will be described in more detail below with reference to FIG. 3. In one example, the roughening features 112 may be formed by irradiating the surface of die pad 104 adjacent to the semiconductor die 108 with a 355 nm wavelength laser having maximum 5 W power with 1 to 150 kHz pulse repetition. The laser irradiation cleans the surface of die pad 104 by burning off any contaminants on the surface and locally melts the surface to form roughening features 112. In one example, at least portions of leads 106 may also include roughening features (not shown).

Semiconductor die 108 is electrically coupled to leads 106 through wire bonds 116. Semiconductor die 108 is attached to the die pad 104 via an attachment material 110. In one example, the attachment material 110 is a glue (e.g., an epoxy glue resin) or another suitable dielectric attachment material. In another example, the attachment material 110 is solder or another suitable electrically conductive attachment material. Semiconductor package 100 includes dendrite (e.g., A2 dendrite) 114 on the roughening features 112 adjacent to the semiconductor die 108. The A2 dendrite is a ZnCr crystalline mass with a branching treelike structure that is electrodeposited onto roughening features 112. In one example, the A2 dendrite is electrodeposited onto metal surfaces of the lead frame 102, the semiconductor die 108, and the bond wires 116.

Semiconductor package 100 includes a mold material 118 encapsulating the semiconductor die 108, the dendrite 114, the bond wires 116, and at least a portion of the substrate 102 (e.g., die pad 104 and inner portions of leads 106). The roughening features 112 and dendrite 114 improve the adhesion of mold material 118 to substrate 102. A process for fabricating semiconductor package 100 will be described below with reference to FIGS. 4A-4E.

Figure 1B:
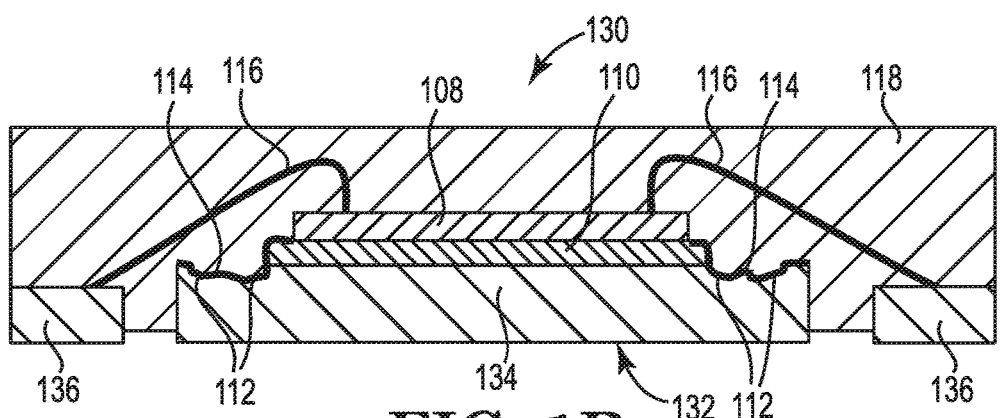
FIG. 1B illustrates a cross-sectional view of another example of a semiconductor package.

FIG. 1B illustrates a cross-sectional view of another example of a semiconductor package 130. Semiconductor package 130 is a leadless semiconductor package. Semiconductor package 130 includes a substrate 132 and a semiconductor die 108. Substrate 132 (e.g., a lead frame) includes a die pad 134 and leads 136. Lead frame 132 has a metal surface, such as Ag, Cu, Ni/Pd/Au, NiNiP, Ni/Pd/AuAg. Die pad 134 includes roughening features 112 as described above with reference to FIG. 1A. The semiconductor die 108 is attached to the die pad 134 such that the roughening features 112 are adjacent to the semiconductor die 108. The area of die pad 134 where semiconductor die 108 is attached to die pad 134 may be free of roughening features. In one example, at least portions of leads 136 may also include roughening features (not shown).

Semiconductor die 108 is electrically coupled to leads 136 through wire bonds 116. Semiconductor die 108 is attached to the die pad 134 via an attachment material 110 as described above with reference to FIG. 1A. Semiconductor package 130 includes dendrite (e.g., A2 dendrite) 114 on the roughening features 112 adjacent to the semiconductor die 108 as described above with reference to FIG. 1A. Semiconductor package 130 includes a mold material 118 encapsulating the semiconductor die 108, the dendrite 114, the bond wires 116, and at least a portion of the substrate 132 (e.g., the upper portions of die pad 134 and leads 136). The roughening features 112 and dendrite 114 improve the adhesion of mold material 118 to substrate 132. A process for fabricating semiconductor package 130 will be described below with reference to FIGS. 5A-5E.

Figure 1C:
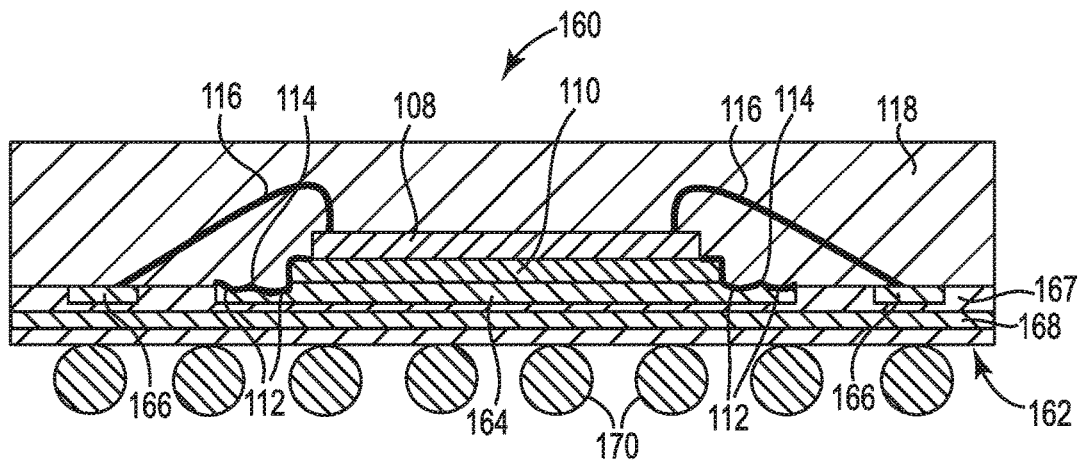
FIG. 1C illustrates a cross-sectional view of yet another example of a semiconductor package.

FIG. 1C illustrates a cross-sectional view of yet another example of a semiconductor package 160. Semiconductor package 160 includes a substrate 162, a semiconductor die 108, and solder balls 170. Substrate 162 includes a die pad 164, contacts 166, a dielectric material 167, and a redistribution layer 168. Die pad 164 and contacts 166 have a metal surface, such as Ag, Cu, Ni/Pd/Au, NiNiP, Ni/Pd/AuAg. Die pad 164 includes roughening features 112 as described above with reference to FIG. 1A. The semiconductor die 108 is attached to the die pad 164 such that the roughening features 112 are adjacent to the semiconductor die 108. The area of die pad 164 where semiconductor die 108 is attached to die pad 164 may be free of roughening features. In one example, at least portions of contacts 166 may also include roughening features (not shown).

Semiconductor die 108 is electrically coupled to contacts 166 through wire bonds 116. Contacts 166 are electrically coupled to solder balls 170 through redistribution layer 168. Semiconductor die 108 is attached to the die pad 164 via an attachment material 110 as described above with reference to FIG. 1A. In one example, semiconductor die 108 is electrically coupled to the die pad 164 in a flip chip configuration. Semiconductor package 160 includes dendrite (e.g., A2 dendrite) 114 on the roughening features 112 adjacent to the semiconductor die 108 as described above with reference to FIG. 1A. Semiconductor package 160 includes a mold material 118 encapsulating the semiconductor die 108, the bond wires 116, the dendrite 114, and at least a portion of the substrate 162 (e.g., die pad 164 and contacts 166). The roughening features 112 and dendrite 114 improve the adhesion of mold material 118 to substrate 162. A process of fabricating semiconductor package 160 will be described below with reference to FIGS. 6A-6E.

Figure 2A:
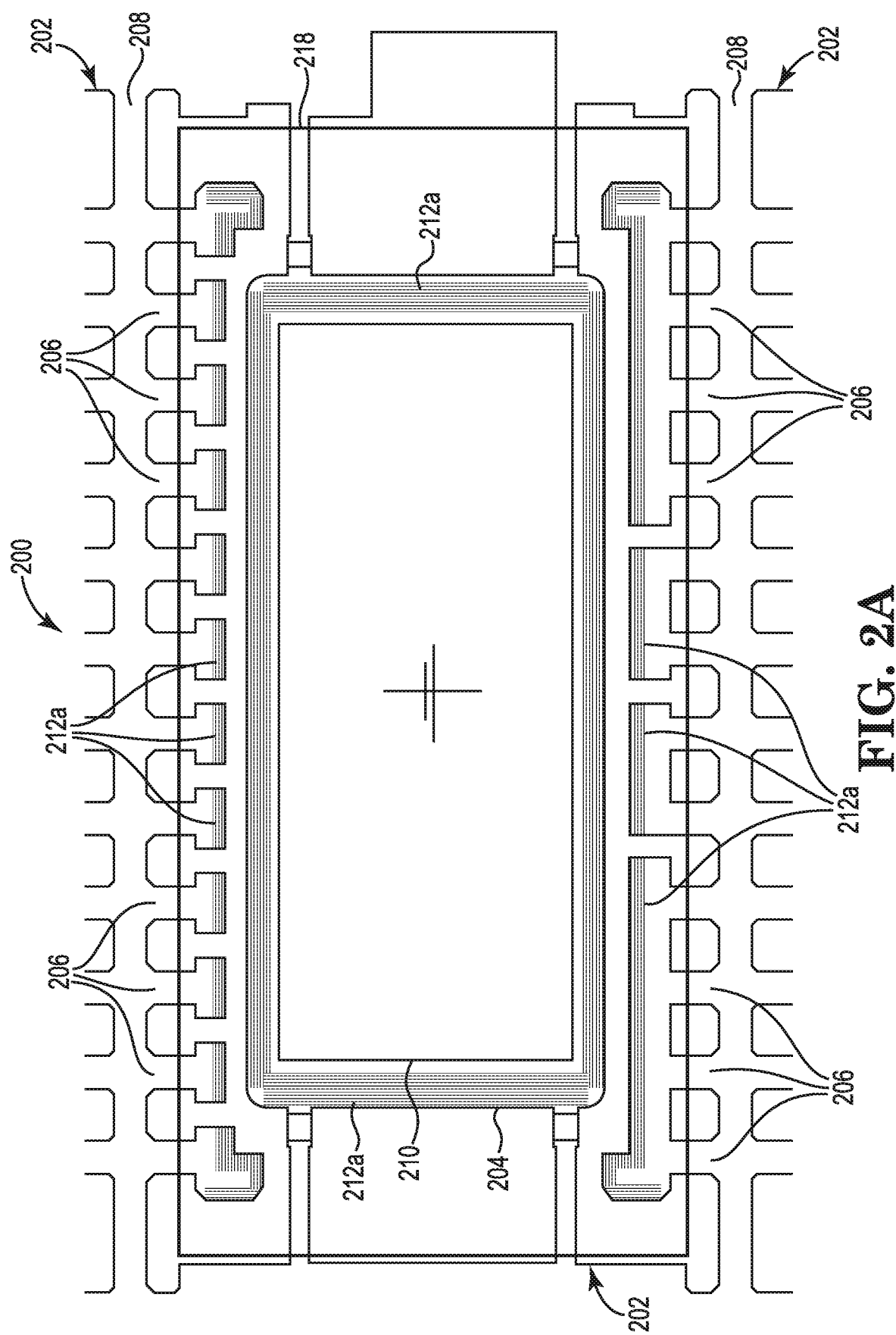
FIG. 2A illustrates a top view of one example of a lead frame including roughening features arranged in a line pattern.

FIG. 2A illustrates a top view of one example of a lead frame 202 including roughening features 212a arranged in a line pattern. Lead frame 202 may be connected to other lead frames 202 via metal bars 208 in a lead frame strip 200. Lead frame 202 includes a die pad 204 and leads 206. A semiconductor die 210 is attached to die pad 204 such that roughening features 212a are adjacent to semiconductor die 210. In one example, roughening features 212a surround semiconductor die 210. The area 218 indicates where mold material will be adhered to lead frame 202. In this example, roughening features 212a are parallel lines extending along the edges of die pad 204 and the edges of leads 206 within area 218. In one example, the parallel line roughening features 212a may be parallel to the edges of die pad 204 and the edges of leads 206. In another example, the parallel line roughening features 212a may be perpendicular to the edges of die pad 204 and the edges of leads 206.

Figure 2B:
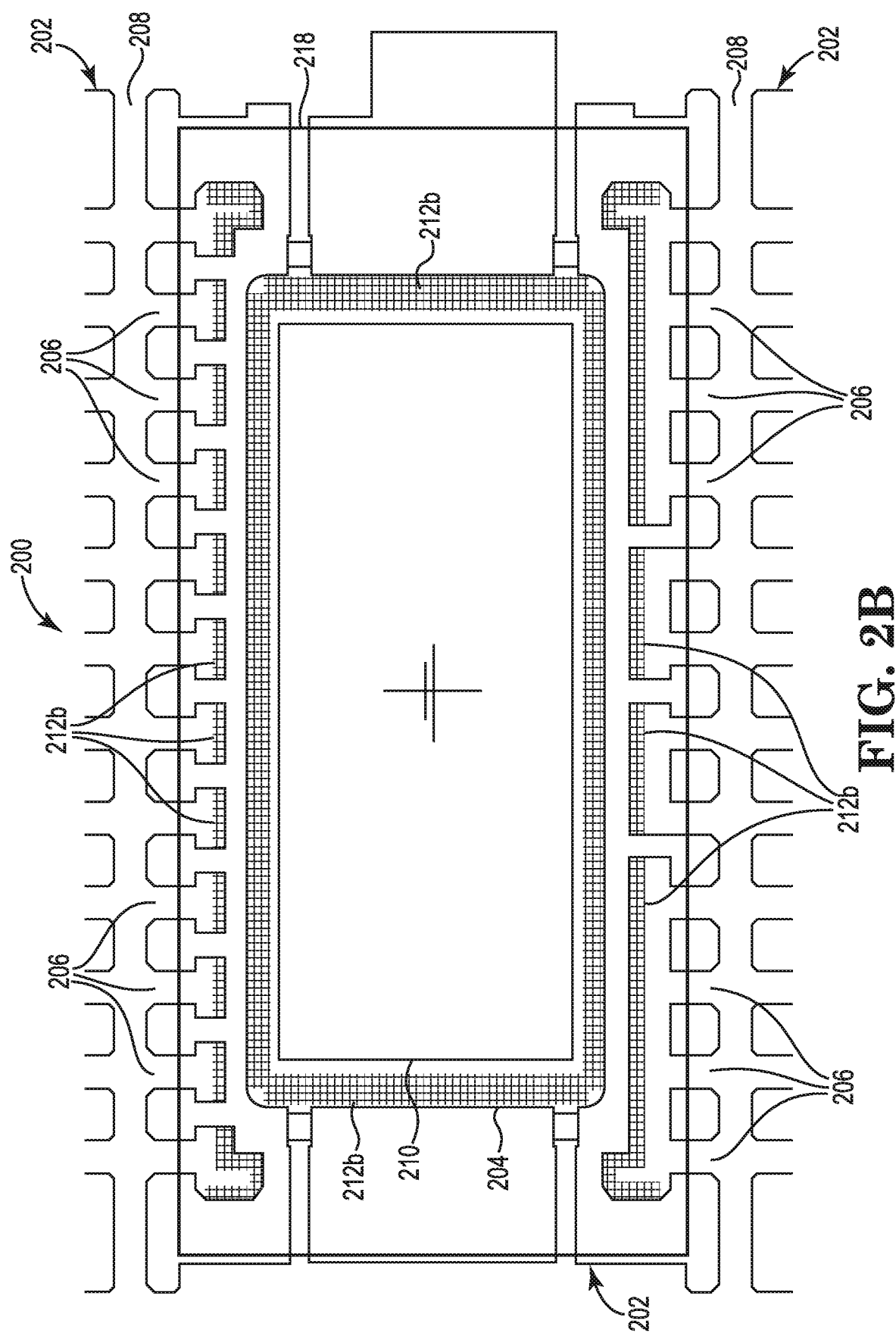
FIG. 2B illustrates a top view of one example of a lead frame including roughening features arranged in a cross pattern.

FIG. 2B illustrates a top view of one example of a lead frame 202 including roughening features 212b arranged in a cross pattern. Lead frame 202 may be connected to other lead frames 202 via metal bars 208 in a lead frame strip 200. Lead frame 202 includes a die pad 204 and leads 206. A semiconductor die 210 is attached to die pad 204 such that roughening features 212b are adjacent to semiconductor die 210. In one example, roughening features 212b surround semiconductor die 210. The area 218 indicates where mold material will be adhered to lead frame 202. In this example, roughening features 212b are formed in a cross pattern extending along the edges of die pad 204 and the edges of leads 206 within area 218. In one example, the cross pattern roughening features 212b may include first parallel lines intersecting second parallel lines, where the second parallel lines are perpendicular to the first parallel lines.

Figure 2C:
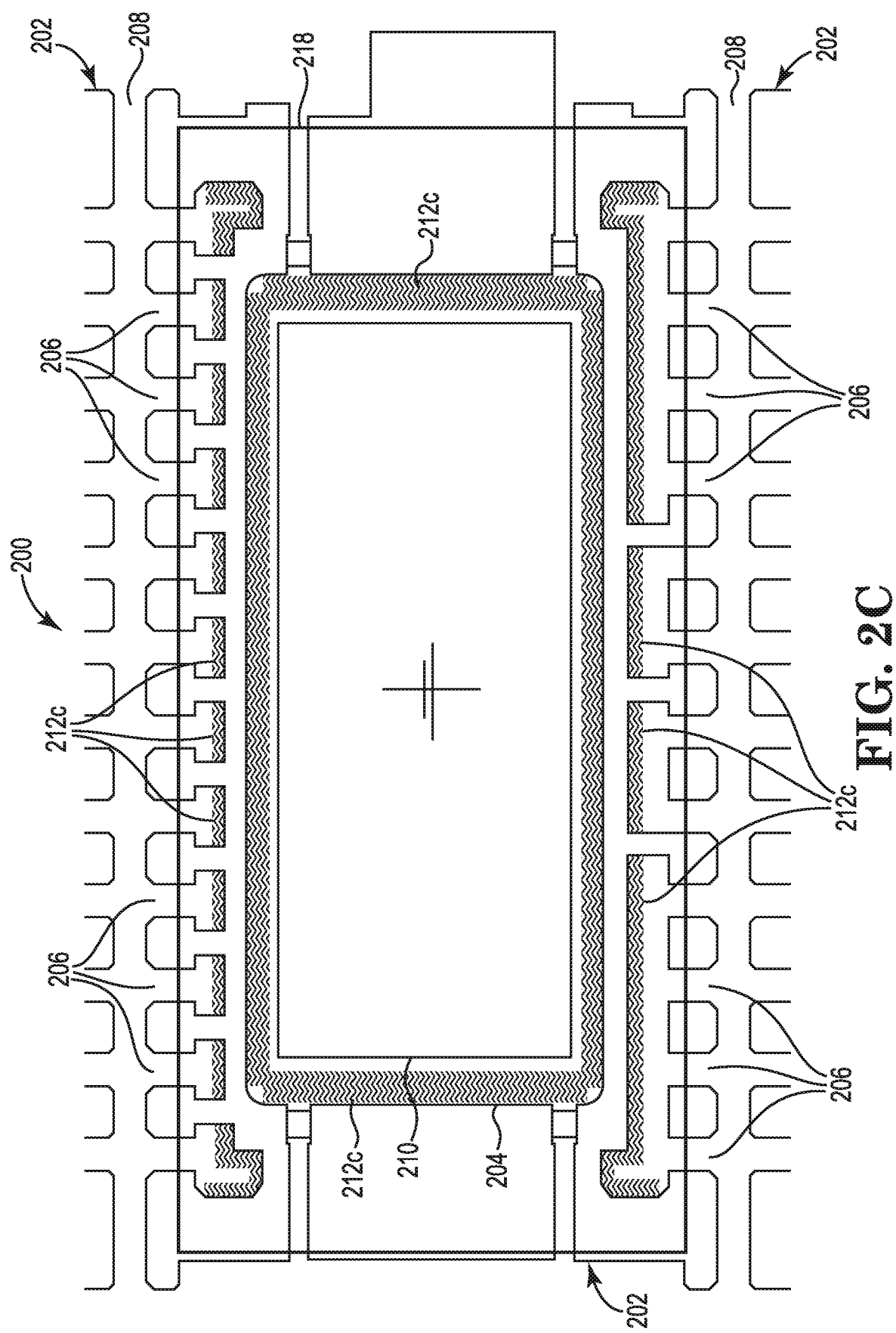
FIG. 2C illustrates a top view of one example of a lead frame including roughening features arranged in a zig zag pattern.

FIG. 2C illustrates a top view of one example of a lead frame 202 including roughening features 212c arranged in a zig zag pattern. Lead frame 202 may be connected to other lead frames 202 via metal bars 208 in a lead frame strip 200. Lead frame 202 includes a die pad 204 and leads 206. A semiconductor die 210 is attached to die pad 204 such that roughening features 212c are adjacent to semiconductor die 210. In one example, roughening features 212c surround semiconductor die 210. The area 218 indicates where mold material will be adhered to lead frame 202. In this example, roughening features 212c are formed in a zig zag pattern extending along the edges of die pad 204 and the edges of leads 206 within area 218. In one example, the zig zag pattern roughening features 212c may include a plurality of zig zag lines parallel to each other.

Figure 2D:
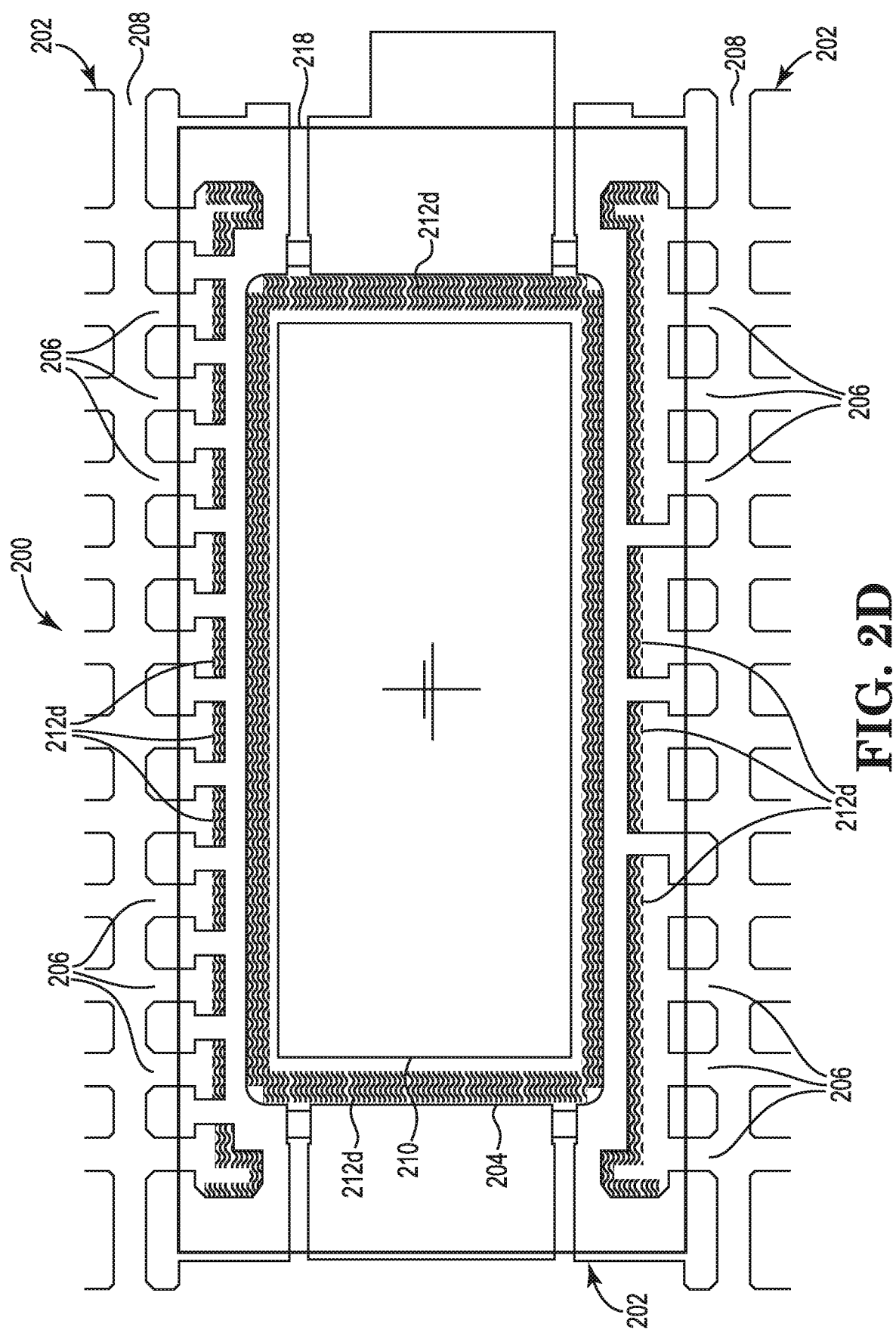
FIG. 2D illustrates a top view of one example of a lead frame including roughening features arranged in a wave pattern.

FIG. 2D illustrates a top view of one example of a lead frame 202 including roughening features 212d arranged in a wave pattern. Lead frame 202 may be connected to other lead frames 202 via metal bars 208 in a lead frame strip 200. Lead frame 202 includes a die pad 204 and leads 206. A semiconductor die 210 is attached to die pad 204 such that roughening features 212d are adjacent to semiconductor die 210. In one example, roughening features 212d surround semiconductor die 210. The area 218 indicates where mold material will be adhered to lead frame 202. In this example, roughening features 212d are formed in a wave pattern extending along the edges of die pad 204 and the edges of leads 206 within area 218. In one example, the wave pattern roughening features 212d may include a plurality of wavy lines parallel to each other.

Figure 2E:
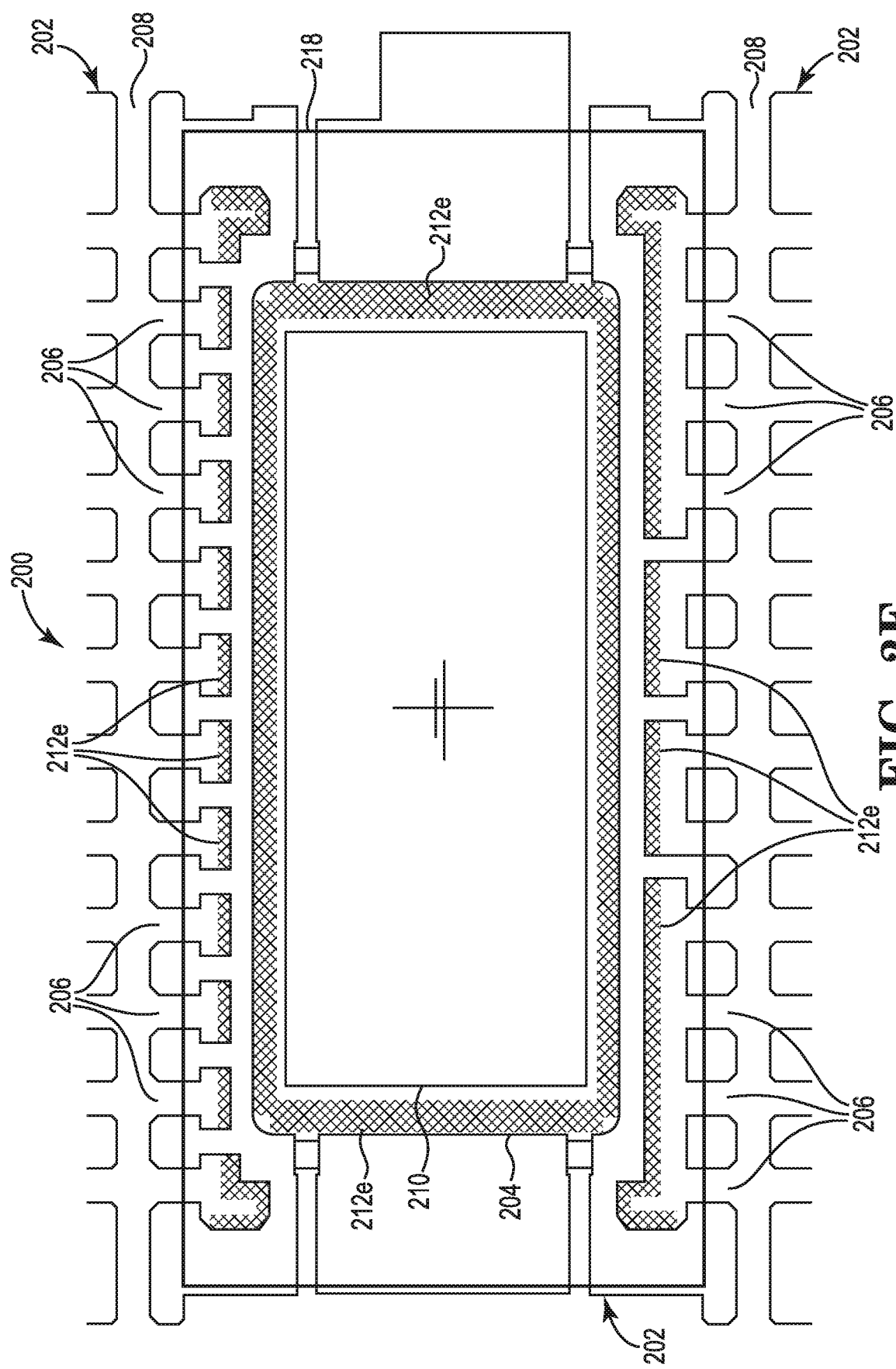
FIG. 2E illustrates a top view of one example of a lead frame including roughening features arranged in a crisscross pattern.

FIG. 2E illustrates a top view of one example of a lead frame 202 including roughening features 212e arranged in a crisscross pattern. Lead frame 202 may be connected to other lead frames 202 via metal bars 208 in a lead frame strip 200. Lead frame 202 includes a die pad 204 and leads 206. A semiconductor die 210 is attached to die pad 204 such that roughening features 212e are adjacent to semiconductor die 210. In one example, roughening features 212e surround semiconductor die 210. The area 218 indicates where mold material will be adhered to lead frame 202. In this example, roughening features 212e are formed in a crisscross pattern extending along the edges of die pad 204 and the edges of leads 206 within area 218. In one example, the crisscross pattern roughening features 212e may include a plurality X-shaped features adjacent to each other.

Figure 2F:
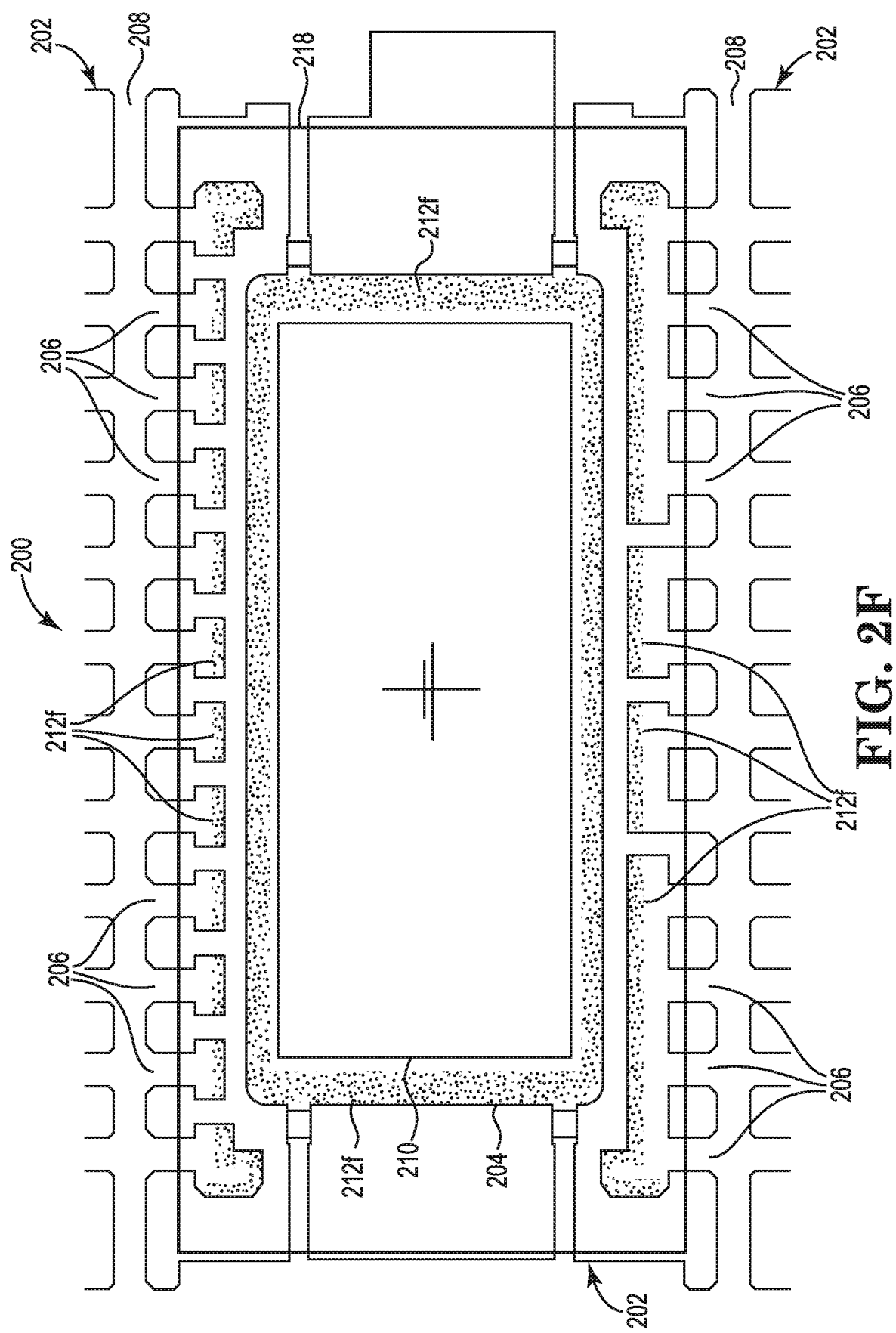
FIG. 2F illustrates a top view of one example of a lead frame including roughening features arranged in a dot pattern.

FIG. 2F illustrates a top view of one example of a lead frame 202 including roughening features 212f arranged in a dot pattern. Lead frame 202 may be connected to other lead frames 202 via metal bars 208 in a lead frame strip 200. Lead frame 202 includes a die pad 204 and leads 206. A semiconductor die 210 is attached to die pad 204 such that roughening features 212f are adjacent to semiconductor die 210. In one example, roughening features 212f surround semiconductor die 210. The area 218 indicates where mold material will be adhered to lead frame 202. In this example, roughening features 212f are formed in a dot pattern extending along the edges of die pad 204 and the edges of leads 206 within area 218. In one example, the dot pattern roughening features 212f may include a plurality of dots adjacent to each other.

Figure 2G:
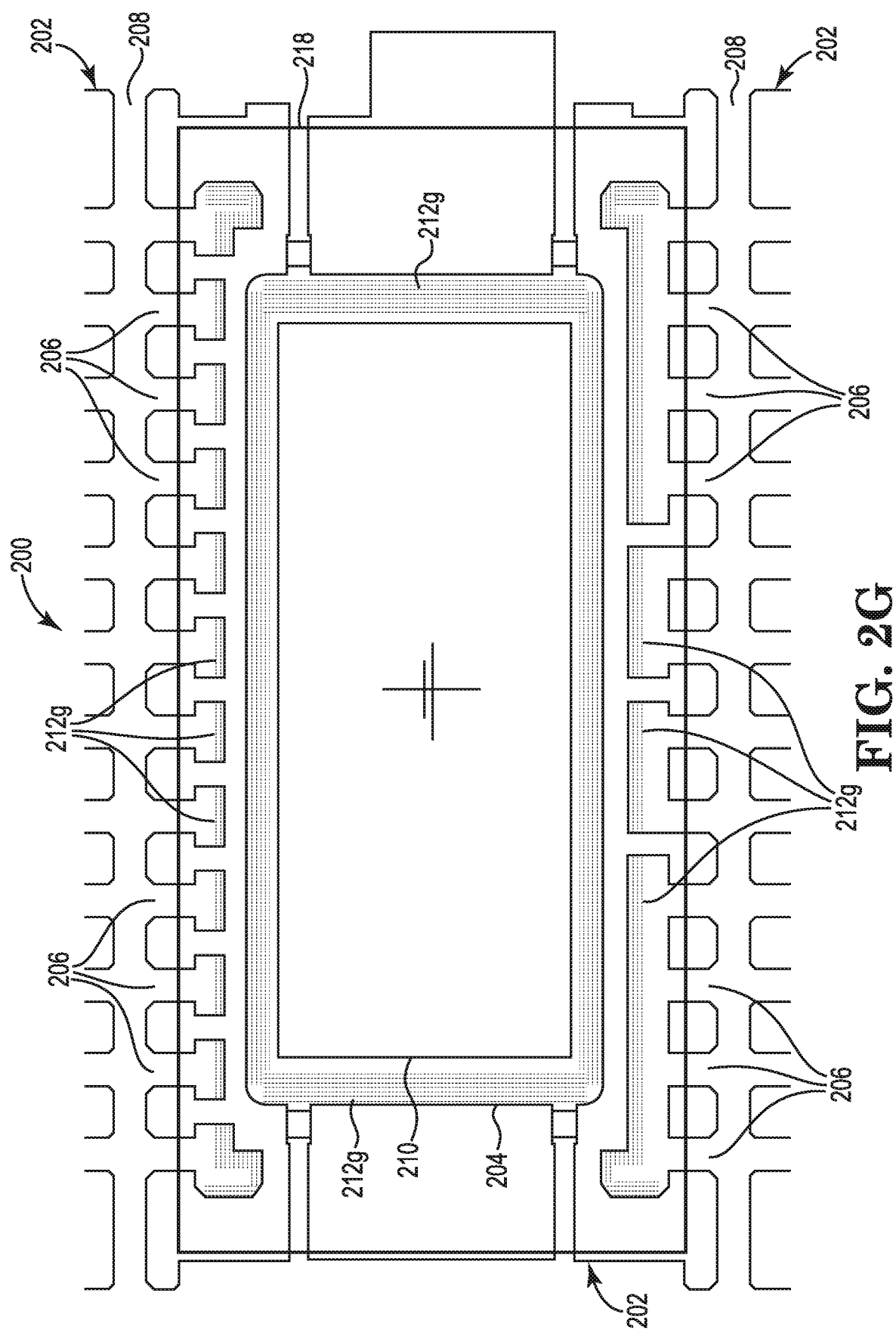
FIG. 2G illustrates a top view of one example of a lead frame including roughening features arranged in a dashed pattern.

FIG. 2G illustrates a top view of one example of a lead frame 202 including roughening features 212g arranged in a dashed pattern. Lead frame 202 may be connected to other lead frames 202 via metal bars 208 in a lead frame strip 200. Lead frame 202 includes a die pad 204 and leads 206. A semiconductor die 210 is attached to die pad 204 such that roughening features 212g are adjacent to semiconductor die 210. In one example, roughening features 212g surround semiconductor die 210. The area 218 indicates where mold material will be adhered to lead frame 202. In this example, roughening features 212g are formed in a dashed pattern extending along the edges of die pad 204 and the edges of leads 206 within area 218. In one example, the dashed pattern roughening features 212g may include dashed lines parallel to each other.

Figure 2H:
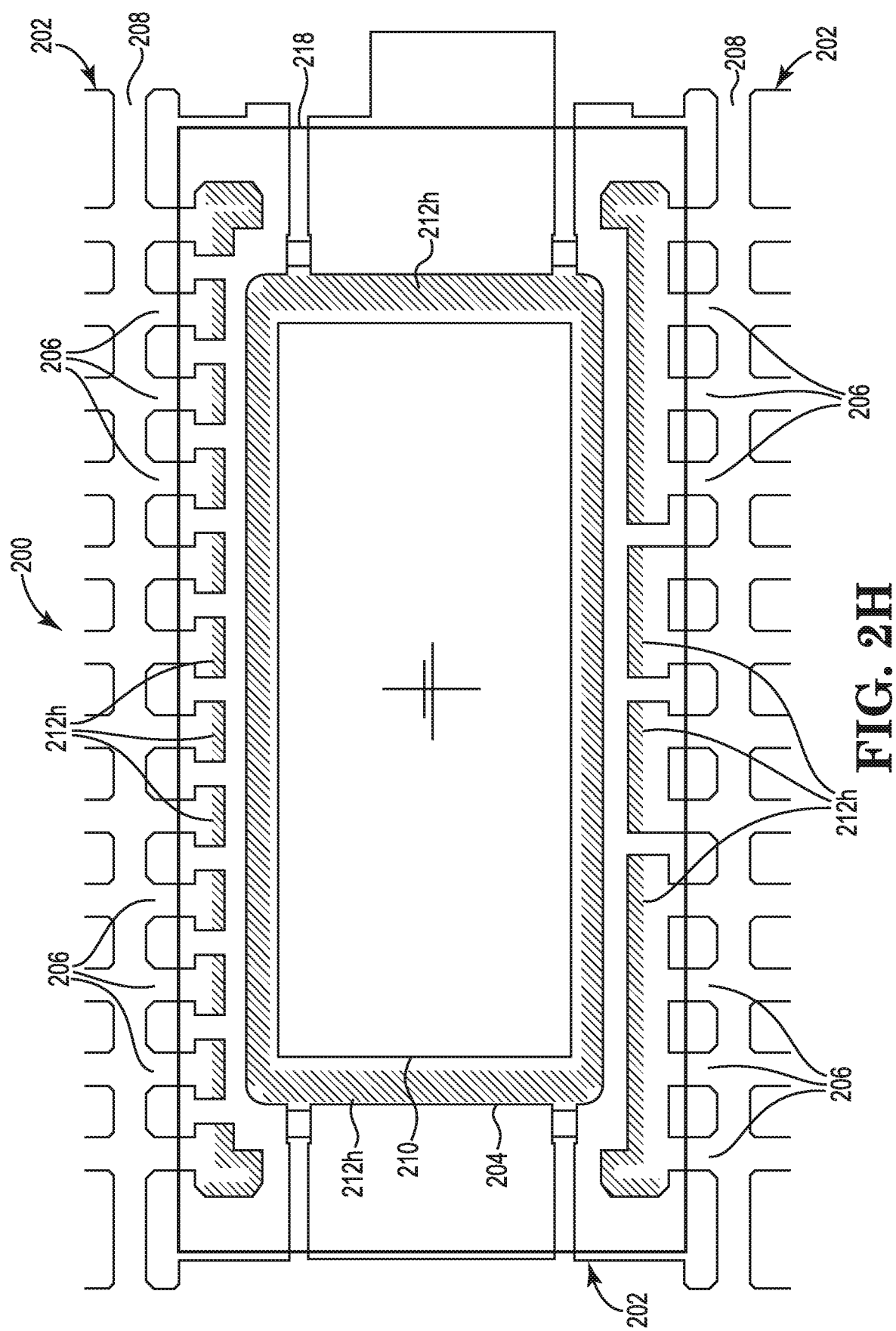
FIG. 2H illustrates a top view of one example of a lead frame including roughening features arranged in a diagonal line pattern.

FIG. 2H illustrates a top view of one example of a lead frame 202 including roughening features 212h arranged in a diagonal line pattern. Lead frame 202 may be connected to other lead frames 202 via metal bars 208 in a lead frame strip 200. Lead frame 202 includes a die pad 204 and leads 206. A semiconductor die 210 is attached to die pad 204 such that roughening features 212h are adjacent to semiconductor die 210. In one example, roughening features 212h surround semiconductor die 210. The area 218 indicates where mold material will be adhered to lead frame 202. In this example, roughening features 212h are formed in a diagonal line pattern extending along the edges of die pad 204 and the edges of leads 206 within area 218. In one example, the diagonal line roughening features 212h may include a plurality of parallel lines at an angle (e.g., 30° to 60° to the edges of die pad 204 and the edges of leads 206.

Figure 2I:
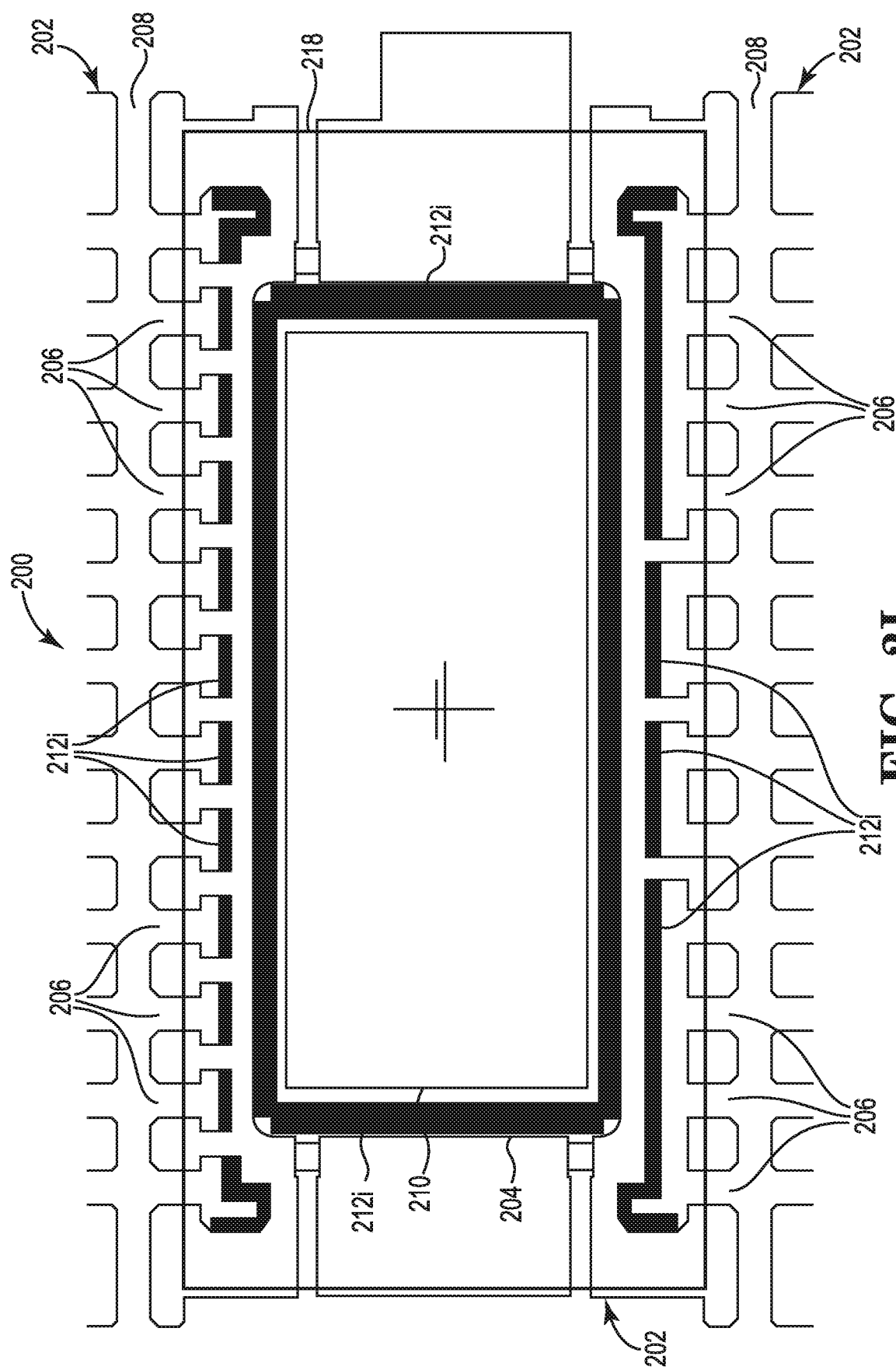
FIG. 2I illustrates a top view of one example of a lead frame including roughening features arranged in a box pattern.

FIG. 2I illustrates a top view of one example of a lead frame 202 including roughening features 212i arranged in a box pattern. Lead frame 202 may be connected to other lead frames 202 via metal bars 208 in a lead frame strip 200. Lead frame 202 includes a die pad 204 and leads 206. A semiconductor die 210 is attached to die pad 204 such that roughening features 212i are adjacent to semiconductor die 210. In one example, roughening features 212i surround semiconductor die 210. The area 218 indicates where mold material will be adhered to lead frame 202. In this example, roughening features 212i are formed in a box pattern extending along the edges of die pad 204 and the edges of leads 206 within area 218. In one example, the box pattern roughening features 212i may include rectangular shaped features extending along each edge of the die pad 204 and each inner edge of leads 206.

While FIGS. 2A-2I illustrate several patterns that may be used for roughening features 212, in other examples, other patterns or combinations of patterns may be used for roughening features 212. The roughening features 212 may include indentations into the metal surface, projections from the metal surface, or combinations thereof.

Figure 3:
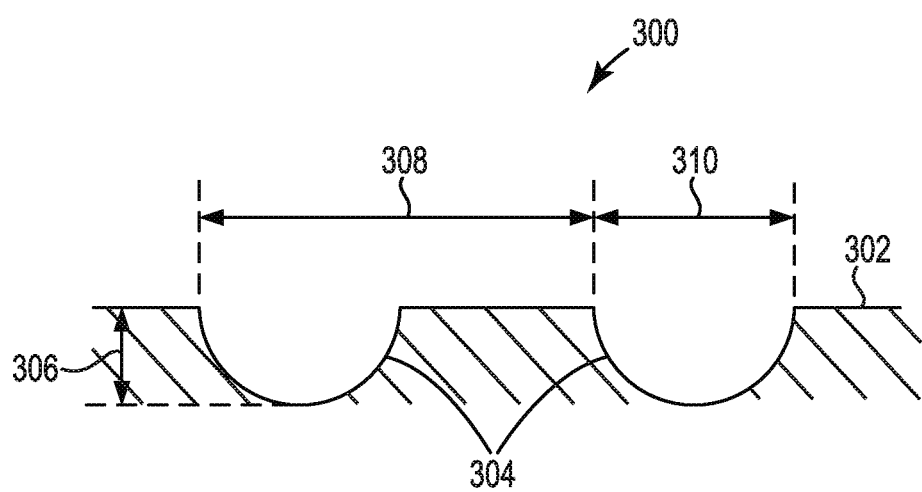
FIG. 3 illustrates an enlarged cross-sectional view of one example of roughening features.

FIG. 3 illustrates an enlarged cross-sectional view of one example of roughening features 304 of a substrate 300. Substrate 300 includes a metal surface 302, such as the metal surface of a die pad or the metal surface of a lead or contact. In one example, roughening features 304 may include a line pattern, a cross pattern, a zig zag pattern, a crisscross pattern, a dot pattern, a wave pattern, a dashed pattern, a diagonal line pattern, or a box pattern as previously described and illustrated with reference to FIG. 2A-2I. In other examples, roughening features 304 may include another suitable pattern or combination of patterns. A depth of the roughening features 304, as indicated at 306, may be within a range between 0.5 μm and 5 μm. A pitch of the roughening features 304, as indicated at 308, may be within a range between 10 μm and 50 μm. A width of the roughening features 304, as indicated at 310, may be within a range between 10 μm and 50 μm. In other examples, roughening features 304 may have another suitable depth, pitch, and/or width.

Figure 4A:
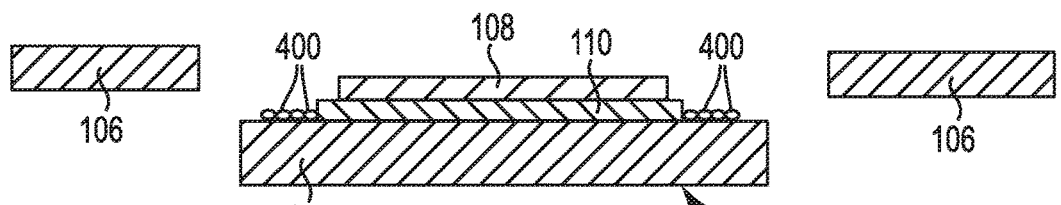
FIGS. 4A-4E illustrate one example of a method for fabricating a leaded semiconductor package.

FIGS. 4A-4E illustrate one example of a method for fabricating a leaded semiconductor package, such as semiconductor package 100 previously described and illustrated with reference to FIG. 1A. As illustrated in FIG. 4A, a semiconductor die 108 is attached to the die pad 104 of a lead frame 102. The semiconductor die 108 may be attached to the die pad 104 via an attachment material 110, such as glue (e.g., epoxy), solder, or another suitable adhesive material. After attaching the semiconductor die 108 to the die pad 104, the attachment material 110 may be cured (e.g., for glue) or reflowed (e.g., for solder). The die attach process may result in contaminants 400 on the metal surface of the die pad 104 adjacent to the semiconductor die 108. The contaminants 400 may include organic or inorganic contaminants. The contaminants may include epoxy glue resin bleed, anti-tarnish, oxidation of metal, protection layers on the metal surface, volatile or non-volatile solvents on the metal surface, solder flux, Sulphur contamination, etc.

Figure 4B:
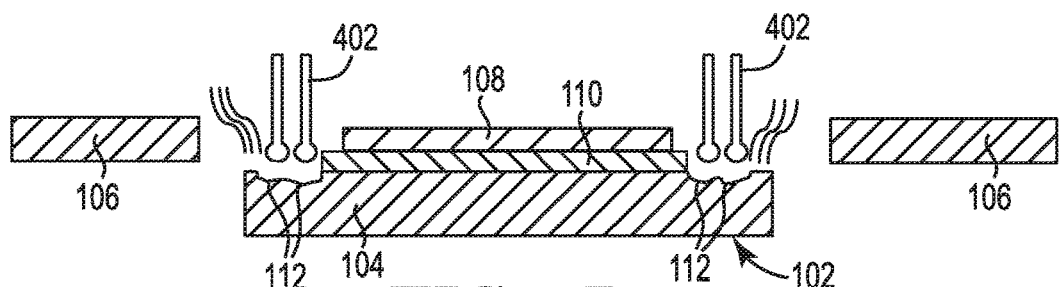

As illustrated in FIG. 4B, portions of die pad 104 are irradiated with a laser beam as indicated at 402. The laser irradiation burns off the contaminants 400 and forms roughening features 112 by local melting of the metal surface of die pad 104 adjacent to semiconductor die 108. In one example, portions of leads 106 may also be irradiated with the laser beam to form roughening features (not shown) on the portions of the leads 106. The laser irradiation may include directing a 355 nm wavelength laser having maximum 5 W power with 1 to 150 kHz pulse repetition to the portions of the die pad 104 adjacent to the semiconductor die 108 and/or to portions of the leads 106.

Figure 4C:
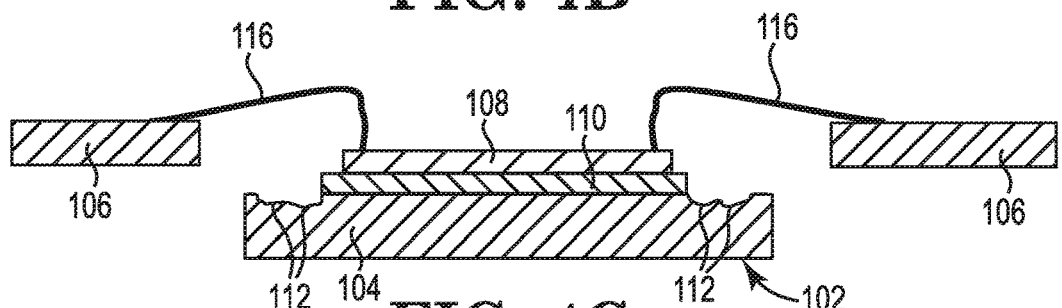
Figure 4D:
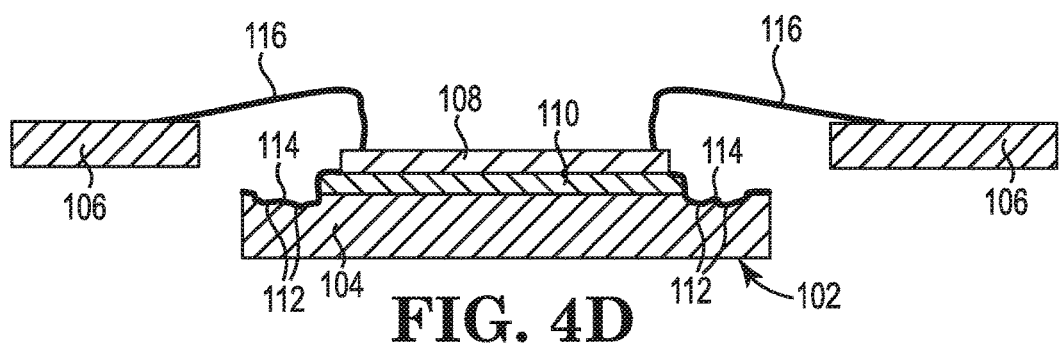
Figure 4E:
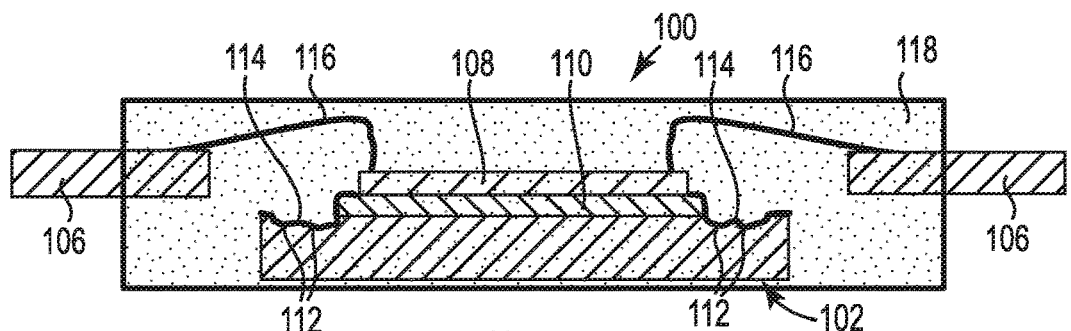

As illustrated in FIG. 4C, semiconductor die 108 is electrically coupled to leads 106 using wire bonds 116. As illustrated in FIG. 4D, a dendrite growth process is used to form dendrite 114 on the roughening features 112. In one example, the dendrite growth process is used to form dendrite on any exposed metal surfaces of lead frame 102, semiconductor die 108, and wire bonds 116. In one example, an A2 dendrite growth process is performed by electroplating the exposed metal surfaces including roughening features 112 with Zn/Cr oxide ions to form A2 dendrite 114. NaOH may be used to enhance the conductivity of the electroplating solution. As illustrated in FIG. 4E, semiconductor die 108, bond wires 116, and at least portions of lead frame 102 are encapsulated with a mold material 118 to provide a semiconductor package 100. A plurality of semiconductor packages 100 may be fabricated from a plurality of lead frames 102 attached to each other in a lead frame strip. In this case, the semiconductor packages 100 may be singulated to separate the semiconductor packages 100 from each other.

Figure 5A:
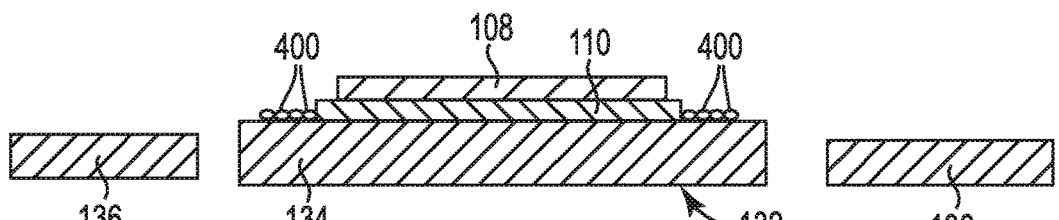
FIGS. 5A-5E illustrate one example of a method for fabricating a leadless semiconductor package.

FIGS. 5A-5E illustrate one example of a method for fabricating a leadless semiconductor package, such as semiconductor package 130 previously described and illustrated with reference to FIG. 1B. As illustrated in FIG. 5A, a semiconductor die 108 is attached to the die pad 134 of a lead frame 132. The semiconductor die 108 may be attached to the die pad 134 via an attachment material 110, such as a glue (e.g., epoxy), solder, or another suitable adhesive material. After attaching the semiconductor die 108 to the die pad 134, the attachment material 110 may be cured (e.g., for glue) or reflowed (e.g., for solder). The die attach process may result in contaminants 400 on the metal surface of the die pad 134 adjacent to semiconductor die 108. The contaminants 400 may include organic or inorganic contaminants. The contaminants may include epoxy glue resin bleed, anti-tarnish, oxidation of metal, protection layers on the metal surface, volatile or non-volatile solvents on the metal surface, solder flux, Sulphur contamination, etc.

Figure 5B:
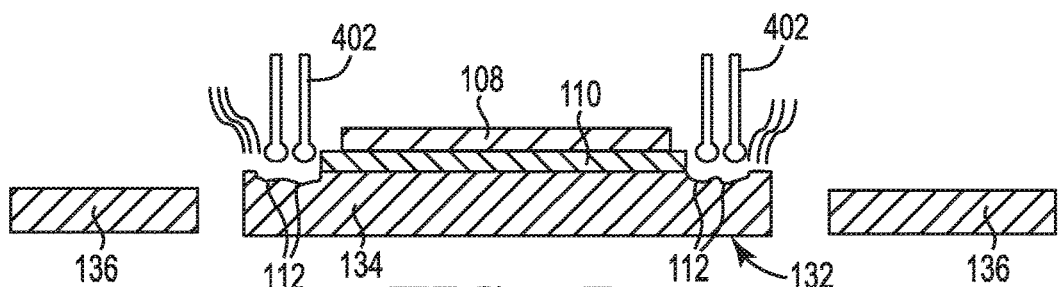

As illustrated in FIG. 5B, portions of die pad 134 are irradiated with a laser beam as indicated at 402. The laser irradiation burns off the contaminants 400 and forms roughening features 112 by local melting of the metal surface of die pad 134 adjacent to semiconductor die 108. In one example, portions of leads 136 may also be irradiated with the laser beam to form roughening features (not shown) on the portions of the leads 136. The laser irradiation may include directing a 355 nm wavelength laser having maximum 5 W power with 1 to 150 kHz pulse repetition to the portions of the die pad 134 adjacent to the semiconductor die 108 and/or to portions of the leads 136.

Figure 5C:
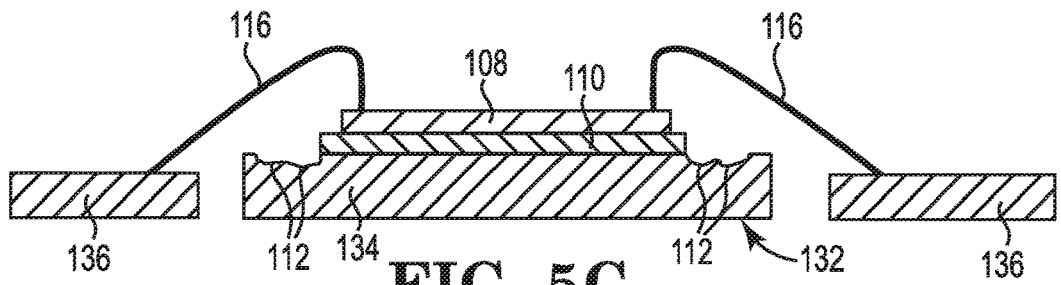
Figure 5D:
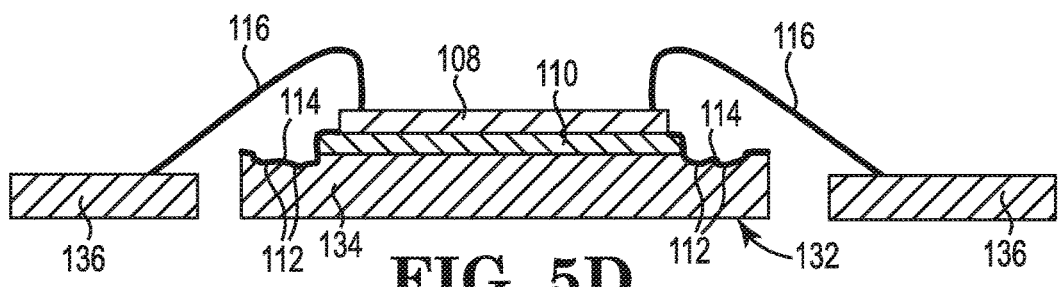
Figure 5E:
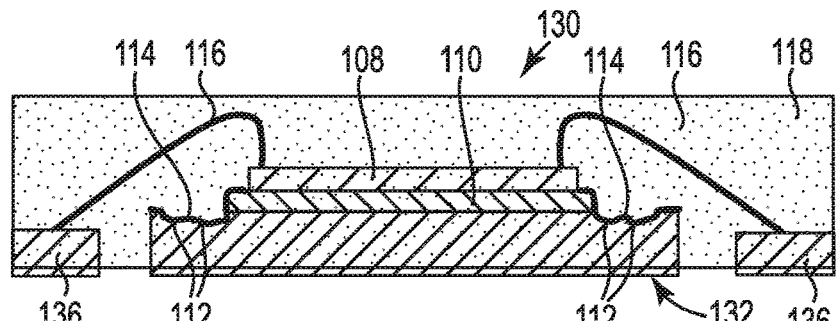

As illustrated in FIG. 5C, semiconductor die 108 is electrically coupled to leads 136 using wire bonds 116. As illustrated in FIG. 5D, a dendrite growth process is used to form dendrite 114 on the roughening features 112. In one example, the dendrite growth process is used to form dendrite on any exposed metal surfaces of lead frame 132, semiconductor die 108, and wire bonds 116. In one example, an A2 dendrite growth process is performed by electroplating the exposed metal surface including roughening features 112 with Zn/Cr oxide ions to form A2 dendrite 114. NaOH may be used to enhance the conductivity of the electroplating solution. As illustrated in FIG. 5E, semiconductor die 108, bond wires 116, and at least portions of lead frame 132 are encapsulated with a mold material 118 to provide a semiconductor package 130. A plurality of semiconductor packages 130 may be fabricated from a plurality of lead frames 132 attached to each other in a lead frame strip. In this case, the semiconductor packages 130 may be singulated to separate the semiconductor packages 130 from each other.

Figure 6A:
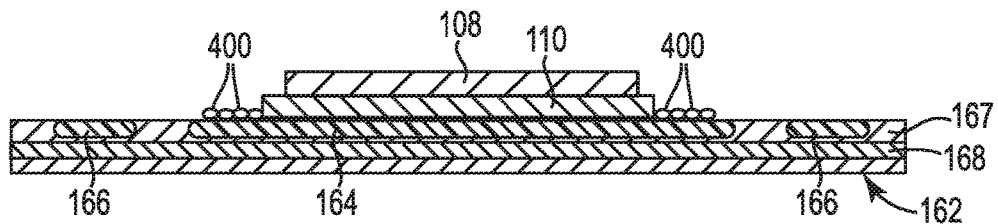
FIGS. 6A-6E illustrate one example of a method for fabricating a semiconductor package with a substrate.

FIGS. 6A-6E illustrate one example of a method for fabricating a semiconductor package with a substrate, such as semiconductor package 160 previously described and illustrated with reference to FIG. 1C. As illustrated in FIG. 6A, a semiconductor die 108 is attached to the die pad 164 of a substrate 162. The semiconductor die 108 may be attached to the die pad 164 via an attachment material 110, such as glue (e.g., epoxy), solder, or another suitable adhesive material. After attaching the semiconductor die 108 to the die pad 164, the attachment material 110 may be cured (e.g., for glue) or reflowed (e.g., for solder). The die attach process may result in contaminants 400 on the metal surface of the die pad 164 adjacent to semiconductor die 108. The contaminants 400 may include organic or inorganic contaminants. The contaminants may include epoxy glue resin bleed, anti-tarnish, oxidation of metal, protection layers on the metal surface, volatile or non-volatile solvents on the metal surface, solder flux, Sulphur contamination, etc.

Figure 6B:
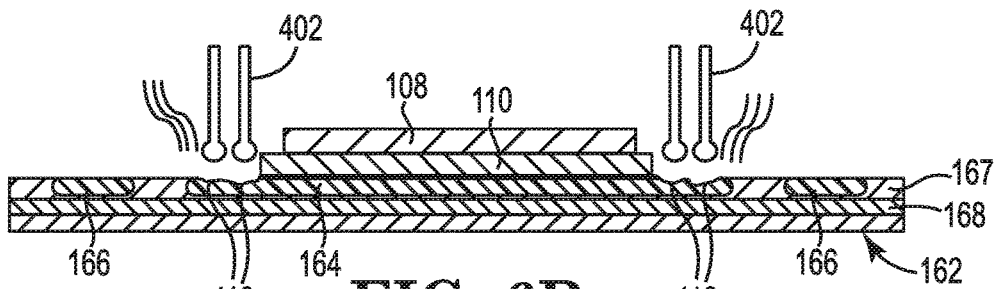

As illustrated in FIG. 6B, portions of die pad 164 are irradiated with a laser beam as indicated at 402. The laser irradiation burns off the contaminants 400 and forms roughening features 112 by local melting of the metal surface of die pad 164 adjacent to semiconductor die 108. In one example, portions of contacts 166 may also be irradiated with the laser beam to form roughening features (not shown) on the portions of the contacts 166. The laser irradiation may include directing a 355 nm wavelength laser having maximum 5 W power with 1 to 150 kHz pulse repetition to the portions of the die pad 164 adjacent to the semiconductor die 108 and/or to portions of the contacts 166.

Figure 6C:
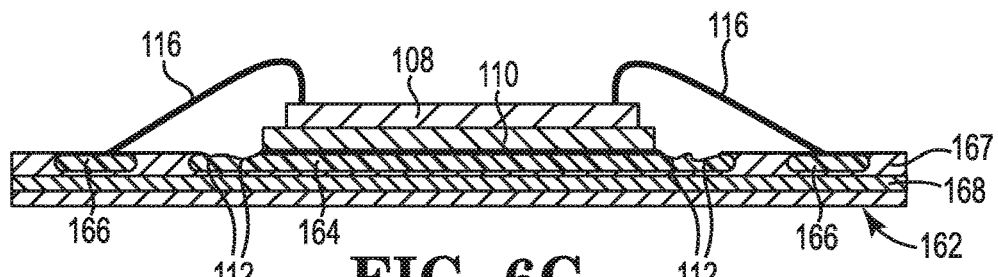
Figure 6D:
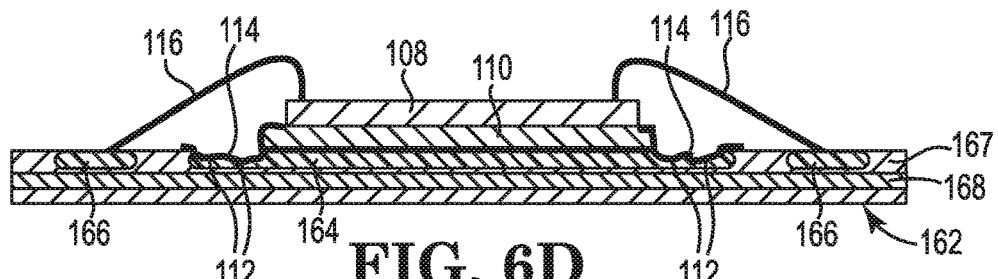
Figure 6E:
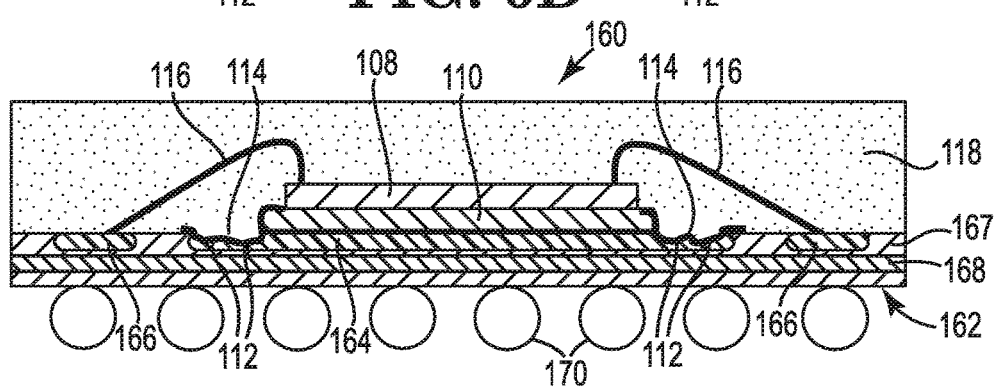

As illustrated in FIG. 6C, semiconductor die 108 is electrically coupled to contacts 166 using wire bonds 116. As illustrated in FIG. 6D, a dendrite growth process is used to form dendrite 114 on the roughening features 112. In one example, the dendrite growth process is used to form dendrite on any exposed metal surfaces of substrate 162, semiconductor die 108, and wire bonds 116. In one example, an A2 dendrite growth process is performed by electroplating the exposed metal surfaces including roughening features 112 with Zn/Cr oxide ions to form A2 dendrite 114. NaOH may be used to enhance the conductivity of the electroplating solution. As illustrated in FIG. 6E, semiconductor die 108, bond wires 116, and at least portions of substrate 162 are encapsulated with a mold material 118 to provide a semiconductor package 160. A plurality of semiconductor packages 160 may be fabricated from a plurality of substrates 162 attached to each other in a strip. In this case, the semiconductor packages 160 may be singulated to separate the semiconductor packages 160 from each other.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. A semiconductor package comprising:
   a substrate comprising a die pad, the die pad comprising roughening features;
   a semiconductor die attached to the die pad via an attachment material such that the roughening features are adjacent to the semiconductor die;
   dendrite on the roughening features and on a surface of the attachment material without the roughening features, the surface of the attachment material without the roughening features adjacent to the semiconductor die; and
   a mold material encapsulating the semiconductor die, the dendrite, and at least a portion of the substrate.

2. The semiconductor package of claim 1, wherein an area of the die pad where the semiconductor die is attached to the die pad is free of roughening features.

3. The semiconductor package of claim 1, wherein the substrate comprises a lead frame, and
   wherein the lead frame comprises leads, the leads comprising roughening features.

4. The semiconductor package of claim 1, wherein the dendrite comprises ZnCr oxide.

5. The semiconductor package of claim 1, wherein the roughening features comprise at least one of a line pattern, a cross pattern, a zig zag pattern, a crisscross pattern, a dot pattern, a wave pattern, a dashed pattern, a diagonal line pattern, and a box pattern.

6. The semiconductor package of claim 1, wherein the roughening features comprises at least one of the following:
   a depth within a range between 0.5 μm and 5 μm,
   a pitch within a range between 10 μm and 50 μm, and
   a width within a range between 10 μm and 50 μm.

7. The semiconductor package of claim 1, wherein the roughening features are formed with a 355 nm wavelength laser having maximum 5 W power with 1 to 150 kHz pulse repetition.

8. A semiconductor package comprising:
   a substrate comprising a die pad;
   a semiconductor die attached to the die pad via an attachment material;
   laser cleaned and formed roughening features on portions of the die pad adjacent to the semiconductor die such that the portions of the die pad adjacent to the semiconductor die are free of contaminants;
   dendrite on the roughening features and on a surface of the attachment material without the roughening features, the surface of the attachment material without the roughening features adjacent to the semiconductor die; and
   a mold material encapsulating the semiconductor die, the dendrite, and at least a portion of the substrate.

9. The semiconductor package of claim 8, wherein an area where the semiconductor die is attached to the die pad is free of roughening features,
   wherein the roughening features comprise at least one of a line pattern, a cross pattern, a zig zag pattern, a crisscross pattern, a dot pattern, a wave pattern, a dashed pattern, a diagonal line pattern, and a box pattern, and
   wherein a depth of the roughening features is within a range between 0.5 μm and 5 μm.

10. The semiconductor package of claim 8, wherein the dendrite comprises ZnCr oxide.

* * * * *